(12) United States Patent
Langer et al.

(10) Patent No.: US 11,012,105 B2
(45) Date of Patent: May 18, 2021

(54) DIGITAL PREDISTORTION OF SIGNALS

(71) Applicant: INTEL CORPORATION, Santa Clara, CA (US)

(72) Inventors: Andreas Langer, Lohhof (DE); Christoph Hepp, Munich (DE); Andreas Menkhoff, Oberhachingm (DE); Gunther Kraut, Egmating (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/646,776

(22) PCT Filed: Sep. 12, 2017

(86) PCT No.: PCT/US2017/051053
§ 371 (c)(1),
(2) Date: Mar. 12, 2020

(87) PCT Pub. No.: WO2019/054980
PCT Pub. Date: Mar. 21, 2019

(65) Prior Publication Data
US 2020/0295790 A1    Sep. 17, 2020

(51) Int. Cl.
*H04L 25/49*    (2006.01)
*H04B 1/04*    (2006.01)
(Continued)

(52) U.S. Cl.
CPC ......... *H04B 1/0475* (2013.01); *H03F 1/3247* (2013.01); *H03F 3/245* (2013.01);
(Continued)

(58) Field of Classification Search
CPC .......... H04B 1/0475; H04B 2001/0425; H03F 1/3247; H03F 3/245; H03F 2201/3231; H03F 2200/102; H03F 2200/451
(Continued)

(56) References Cited

U.S. PATENT DOCUMENTS

| | | | |
|---|---|---|---|
| 2001/0050592 A1* | 12/2001 | Wright | H03F 1/3258 330/2 |
| 2008/0152037 A1* | 6/2008 | Kim | H04W 40/02 375/297 |

(Continued)

OTHER PUBLICATIONS

International Search Report dated May 3, 2018 for International Application No. PCT/US2017/051053.
(Continued)

*Primary Examiner* — Don N Vo
(74) *Attorney, Agent, or Firm* — Eschweiler & Potashnik, LLC

(57) ABSTRACT

Systems, circuitries, and methods for predistorting a digital signal in a transmit chain based on a predistortion function are provided in which the function is determined based on a first digital signal or a first transmit chain state. A method includes: receiving a second digital signal that is input to the transmit chain, wherein the transmit chain is characterized by a present transmit chain state; performing a first operation on the second digital signal to generate an adapted digital signal, wherein the first operation is based on either a relationship between the first digital signal and the second digital signal, or a relationship between the first transmit chain state and the present transmit chain state; predistorting the adapted digital signal based on the predistortion function; and performing a second operation on the predistorted adapted signal, wherein the second operation corresponds to an inverse of the first operation.

18 Claims, 4 Drawing Sheets

(51) Int. Cl.
*H03F 1/32* (2006.01)
*H03F 3/24* (2006.01)

(52) U.S. Cl.
CPC .. *H03F 2200/102* (2013.01); *H03F 2200/451* (2013.01); *H03F 2201/3231* (2013.01); *H04B 2001/0425* (2013.01)

(58) Field of Classification Search
USPC .................................................. 375/266–298
See application file for complete search history.

(56) References Cited

U.S. PATENT DOCUMENTS

| | | | |
|---|---|---|---|
| 2008/0211576 A1* | 9/2008 | Moffatt | ..................... H03F 3/24 330/149 |
| 2009/0252255 A1 | 10/2009 | Lee et al. | |
| 2010/0297966 A1 | 11/2010 | Row et al. | |
| 2011/0025414 A1 | 2/2011 | Wolf et al. | |
| 2015/0214987 A1* | 7/2015 | Yu | ............................ H03F 1/02 375/297 |

OTHER PUBLICATIONS

International Preliminary Report on Patentability dated Mar. 26, 2020 for International Application No. PCT/US2017/051053.

* cited by examiner

DIGITAL PREDISTORTION OF SIGNALS

This application is a National Phase entry application of International Patent Application No. PCT/US2017/051053 filed Sep. 12, 2017, and is hereby incorporated by reference in its entirety.

BACKGROUND

In wireless device transmit chains, the transmit signal is often predistorted to compensate for nonlinearities in components as well as expected distortions of the transmit signal and/or noise that will be added to the signal elsewhere in the transmit chain. A predistortion function is applied to the transmit signal to predistort the transmit signal. The predistortion function is derived based on experience gained during prior operation of the transmit chain or transmit chain components. When the predistortion is performed in the digital (e.g., baseband) domain, the predistortion function may take the form of a summation of weighted past and present values of the transmit signal. During a calibration or learning phase, coefficients or weights that are used to weigh past and present values of the transmit signal are derived and stored for use in predistorting the transmit signal during operation of the transmit chain.

DETAILED DESCRIPTION

Figure 1:
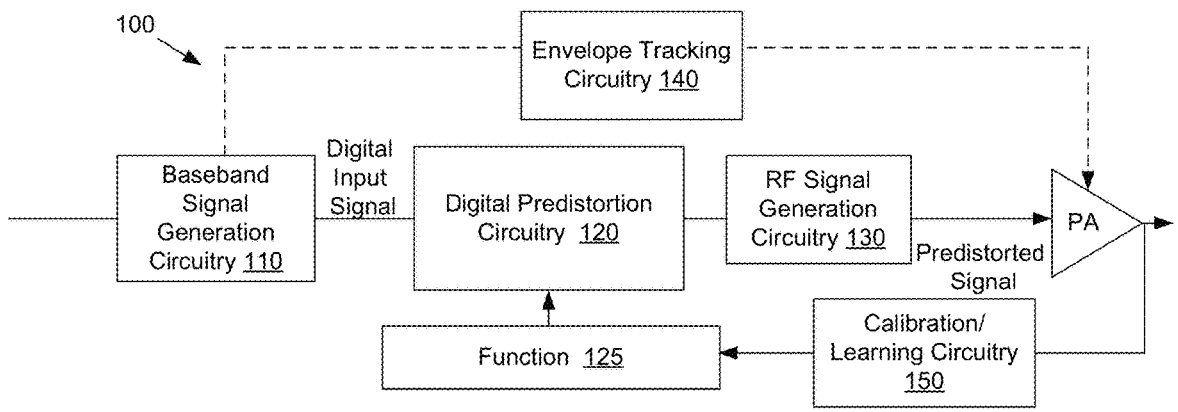
FIG. 1 illustrates an exemplary predistortion system that includes digital predistortion circuitry that predistorts a digital input signal to compensate for envelope tracking circuitry.

The present disclosure will describe predistortion systems in the context of envelope tracking under the 5G New Radio (NR) standard. However, the predistortion methods, systems, and techniques described herein are applicable to predistortion used to compensate for other sources of non-linearity, distortion, and/or noise in a transmit signal.

5G NR is a new communication standard that is expected to feature higher bandwidth (e.g., 2×100 MHz or 200 MHz aggregated) and more complex modulation schemes in the uplink (e.g., evolved single carrier frequency division multiplexing (SC FDM) up to 256 QAM). One challenge for mobile devices that support 5G NR is the higher channel bandwidth. For example, in 5G NR, bandwidths of 200 MHz or more are utilized in the sub 6 GHz range and bandwidths of more than 400 MHz are utilized in the millimeter range. This makes it difficult to effectively predistort transmit signals over the whole range of bandwidths. Another challenge is that the 5G NR modulation schemes involve signals with higher peak-to-power ratio (PAPR) which usually reduces the efficiency of the power amplifier (PA) when the PA operates in average power tracking (APT) mode. APT mode describes a PA supply concept where the PA cores are supplied by a DCDC converter and where the output voltage of the DCDC converter (PA supply voltage) is adjusted based on the average output power target within an upcoming time interval (e.g., transmission slot). The low PA efficiency is caused by the large voltage headroom that is required for the PA cores in order to prevent RF voltage clipping and a subsequent degradation of the PA linearity characteristic (e.g., adjacent channel leakage power ratio (ACLR), error vector magnitude (EVM)).

Envelope tracking (ET) is known to solve the efficiency decrease for modulation schemes with high PAPR. In ET mode, the PA operates close to its peak efficiency relatively independent of the PAPR. In ET mode the PA efficiency is clearly increased since the required PA headroom is less than 1 dB which boosts the PA efficiency. The downside of ET is the lower efficiency of the ET DCDC converter which is typically around 85% (depending on signal bandwidth) whereas the DCDC converter efficiency in APT mode is around 95%. However, the overall system efficiency includes the efficiency of the PA which is significantly increased by ET at high PAPR, meaning that ET outperforms APT for high PAPR applications.

Compared to APT, ET introduces significant nonlinear effects in the transmit chain which partially depend on the radio frequency (RF) frequency of the transmit chain. As a result, the nonlinear characteristic can change within a few MHz, causing a dispersive transmit channel. In a dispersive transmit channel, the predistortion characteristic is strongly mapped to the absolute RF frequency. A predistortion function (e.g., digital predistortion (DPD) coefficients) that is optimized for a first frequency range will show less linearity improvement in a second frequency range if the second frequency range is shifted by even a few MHz when the channel is dispersive. Some factors that cause a dispersive channel in ET mode include ET delay dispersion over frequency, a tracker bandwidth that is too low cutting the envelope bandwidth and introducing variations in delay, a too low VCC bandwidth in the PA module, and PA load-pulling due to the transmit filter. Load pulling may be especially severe in ET systems because the PA operates in compression, causing a higher load sensitivity. Transmit filters feature an input impedance (which is equal to the PA impedance) that is highly frequency dependent due to the resonators being used to form the filter characteristics.

The ET delay dispersion and PA load-pulling are the dominating effects for a dispersive channel. Both effects occur in the center of a transmit band but get more severe at the band edges with the transition from pass band to stop band. At a very high transmit bandwidth (e.g., greater than 400 MHz), APT operation is usually the preferred PA power supply scheme because ET systems simply cannot support such high bandwidths. In APT operation, there are at least two dominating effects introducing memory into the transmit chain. PA load pulling due to the transmit filter is an issue in APT operation, but is less pronounced than with ET systems. Limited PA bias bandwidth is an issue with APT meaning that the PA bias network should be designed to provide a low impedance at DC up to baseband frequencies to avoid re-modulation effects. The issues caused by limited PA bias bandwidth depend on the RF envelope and how fast the envelope changes.

PA load pulling effects depend on the instantaneous RF frequency and the impedance response of the TX filter over the modulation bandwidth. When the instantaneous modulation is at a first frequency the PA is loaded by a first impedance and when the instantaneous modulation is at a second frequency the PA is loaded by a second impedance. The impedances may be quite different especially if the instantaneous separation between the frequencies is large, which generally is the case with a signal of high transmit bandwidth. As a result the amplitude modulation-amplitude modulation (AM-AM) and the amplitude modulation-phase modulation (AM-PM) response at the first frequency is different from the response at the second frequency. The problems that arise from the support of complex modulation schemes and high transmit bandwidths may be addressed using memory predistortion. However, the implementation of memory predistortion becomes more difficult as the transmit bandwidth increases. To linearize a PA the predistortion circuitry should create an intermodulation (IM) spectrum that cancels the IM spectrum of the PA at its output.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuitry" and the like are intended to refer to a computer-related entity, hardware, software (e.g., in execution), and/or firmware. For example, a circuitry can be a circuit, a processor, a process running on a processor, a controller, an object, an executable, a program, a storage device, and/or a computer with a processing device.

FIG. 1 illustrates an exemplary predistortion system 100 that includes ET circuitry 140 and also predistorts a digital input signal to compensate for effects of ET. The ET operation "introduces" memory into the system 100 which means that AMAM and AMPM conversion of the PA depends on the symbol sequence of the digital input signal, which is used to generate the RF signal. More precisely, the AMAM and AMPM conversion changes as a function of how fast the RF envelope instantaneously changes and as a function of the instantaneous RF frequency. A digital predistortion circuitry 120 predistorts the digital input signal to compensate for the nonlinear effects that change over RF frequency or due to the modulation content. To compensate for the memory introduced by ET, the digital predistortion circuitry 120 predistorts the digital input signal based on past values of the digital input signal A predistortion function 125 is formulated to compensate for the memory effect of the ET circuitry 140 on the behavior of the PA (e.g., the function may be a polynomial that is a function of past and present values of the digital input signal). The system 100 includes baseband signal generation circuitry 110 that generates the digital input signal encoding information to be communicated. Digital predistortion circuitry 120 reads a predistortion function or coefficients that describe a predistortion function 125 stored in memory and applies the function to the digital input signal. The predistortion function 125 can be a polynomial representation, a physical based model, a model emulating physical effects, or any other model that is appropriate to describe the non-linear impairments of the PA. The output of the digital predistortion circuitry is a predistorted digital signal that is upconverted by RF signal generation circuitry 130 into a predistorted RF signal that is input to the PA.

The predistortion function 125 is determined by calibration, optimization, or learning. Calibration, which is often performed in the factory, is performed by inputting one or more known calibration signals to the digital predistortion circuitry 120 and measuring the output of the PA. Calibration/learning circuitry 150 derives the function (e.g., DPD coefficients) based on the output of the PA. In optimization or learning, the calibration learning circuitry 150 derives the function during normal operation of the transmit chain. In other words, in optimization or learning, the function is derived based on the PA's response to a transmit signal that occurs in normal operation rather than a special calibration signal that is generated during the calibration process. For the purposes of this description, the term "calibration" will be used to encompass both calibration as well as optimization/learning.

In calibration the predistortion function is derived based on a given signal (e.g., either the calibration signal or the "normal operation" signal) having certain characteristics and also on a certain transmit chain state. For example, the center frequency of the given signal will have a significant impact on the predistortion function if the transmit chain is dispersive which might occur at the edge of a transmit band where the filter skirt of the transmit band pass filter kicks in or due to ET operation since the ET delay dispersion is dependent on the RF frequency. The ET delay dispersion is caused by the transmit filter impedance that changes over RF frequency and means that an optimum alignment of the RF envelope and voltage envelope generated by an ET converter depends on the RF frequency. In the case of a modulated signal the ET delay dispersion means that optimum delay is a function of instantaneous modulation frequency that corresponds to an instantaneous RF frequency.

In addition to center frequency, the gain state of the transmit chain during determination of the predistortion function will also have a significant impact on the predistortion function. Any gain change after the digital predistortion circuitry 120 is important. When the gain after the digital predistortion circuitry 120 changes relative to the gain during learning then the IM spectrum generated by digital predistortion circuitry 120 no longer matches the IM spectrum generated by the PA. Due to the gain change the input power of the PA changes which affects the PA's IM spectrum. Since the gain change happens after the digital predistortion circuitry 120, the gain change is not compensated for by the predistortion function 125. Thus, during normal (non-calibration operation) operation if the digital input signal differs from the given signal or the transmit chain gain state differs from the gain during calibration the predistortion function may not effectively compensate for the effects of the ET circuitry 140.

To account for the limited applicability of a predistortion function to signals or transmit chain states different from calibration signals/transmit chain states, some predistortion systems store multiple predistortion functions mapped to various parameters such as the transmit signal's center frequency or the transmit chain's gain. This results in more time calibrating and also more memory to store the multiple predistortion functions.

Described herein are systems, methods, and circuitries that allow a predistortion function that is optimized for a first frequency range or transmit chain state to be reused for a different frequency range and/or transmit chain state. This reduces the number of predistortion functions that need be stored and allows for a wider range of effective predistortion without additional learning or calibration.

Figure 2:
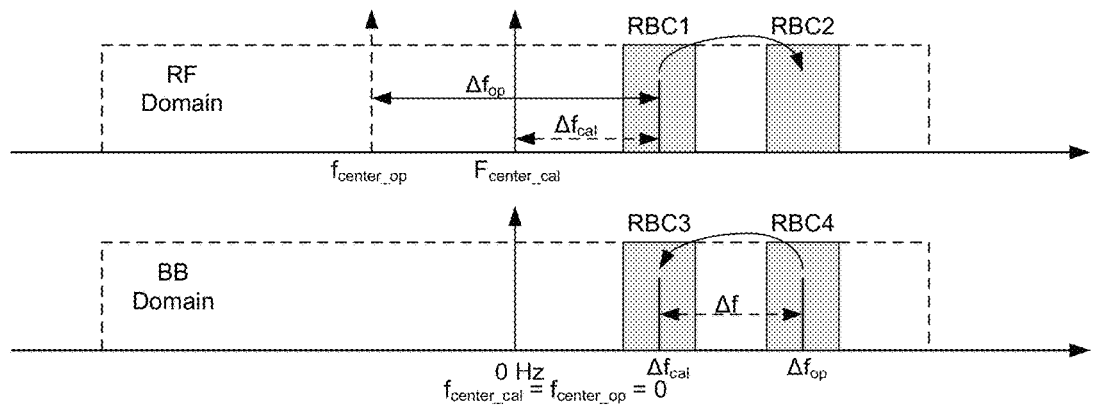
FIG. 2 illustrates the effect on predistortion of a difference in a resource block's center frequency and a center frequency used during calibration or learning.

FIG. 2 illustrates an example of how a difference between a center frequency of a transmit signal and the center frequency of a calibration signal can result in an incorrect predistortion function being applied to the transmit signal. The upper part of FIG. 2 shows the RF domain and the lower part of FIG. 2 shows the baseband (BB) domain assuming zero intermediate frequencies (IF). The predistortion function (e.g., DPD coefficients) is calibrated for the frequency range indicated by the dotted line. As an example, the calibrated frequency range could be a long term evolution (LTE)-60 channel that covers a bandwidth of 60 MHz. The calibration was done using a calibration signal having a center frequency $f_{center\_cal}$. The resource block cluster (RBC)1 includes a number of resource blocks that are located inside the calibrated frequency range. The center frequency of RBC1 is $f_{center\_op}$. Note that RBC1 falls within the frequency range for which the predistortion function has been calibrated and thus the predistortion function derived for the 60 MHz band will be applied.

RBC3 indicates the position in the BB domain that the downconverted RBC1 should occupy after proper predistortion. However, because the relationship between RF domain and the BB domain is established based on the center frequency of the calibration signal, the digital predistortion circuitry 120 sets $f_{center\_cal}$ equal to $f_{center\_op}$. This causes the RBC1 to appear, to the predistortion circuitry, to be located at the position indicated by RBC2. Thus, the predistortion circuitry 120 improperly predistorts the digital input signal, resulting in a predistorted baseband symbol located as indicated by RBC4.

In other words, the predistortion circuitry 120 relies on a correct mapping between the RF frequency domain and the BB frequency domain. The mapping is established during calibration and is given by the calibration signal center frequency. If the center frequency of the transmit signal is different than the calibration signal center frequency a frequency offset of is introduced in the mapping between the RF domain and the BB domain. The frequency offset is equivalent to the difference between the center frequency of the calibration signal and the center frequency of the transmit signal. This causes performance degradation if the channel is highly dispersive.

Figure 3:
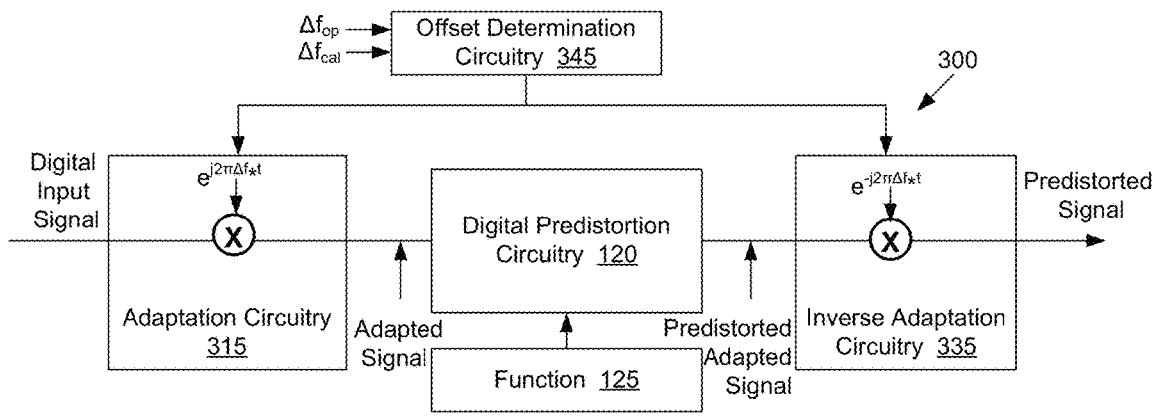
FIG. 3 illustrates an exemplary predistortion system that includes adaptation circuitry and inverse adaptation circuitry to adapt an input signal to compensate for a difference in input signal as compared to a signal used during calibration or learning, in accordance with various aspects described.

FIG. 3 illustrates a predistortion system 300 that addresses the problem of the frequency offset between the calibration signal and the transmit signal. The system 300 includes offset determination circuitry 345 that determines the frequency offset of between the "calibration" center frequency of the calibration signal and the "operation" center frequency transmit signal. The offset determination circuitry 345 controls adaptation circuitry 315 and inverse adaptation circuitry 345 based on the frequency offset. The adaptation circuitry 315 is disposed after the baseband signal generation circuitry (110 FIG. 1) and shifts the digital input signal based on the frequency offset. Referring back to FIG. 2, this shifts a digital input signal RBC4 (the erroneous position of the RBC1 in baseband) to an adapted signal RBC3. This adapted signal is predistorted by the predistortion circuitry using the correct frequency range. In other words, the predistortion function that was determined based on the calibration signal can now be used to predistort the adapted signal. The predistorted adapted signal is then shifted back by inverse adaptation circuitry 335 to its original center frequency RBC4, which will result in a correct RF domain signal of RBC1.

The adaptation circuitry 315 includes a multiplier (e.g., coordinate rotation digital computer (CORDIC)) that "corrects" the frequency offset between the calibration center frequency which is necessary to have correct mapping between the RF domain and the BB domain. Inverse adaptation circuitry 335, which is disposed after the digital predistortion circuitry 120, includes a multiplier that shifts the predistorted adapted signal by the frequency offset and thus back to the correct frequency prior to upconversion to RF.

Figure 4:
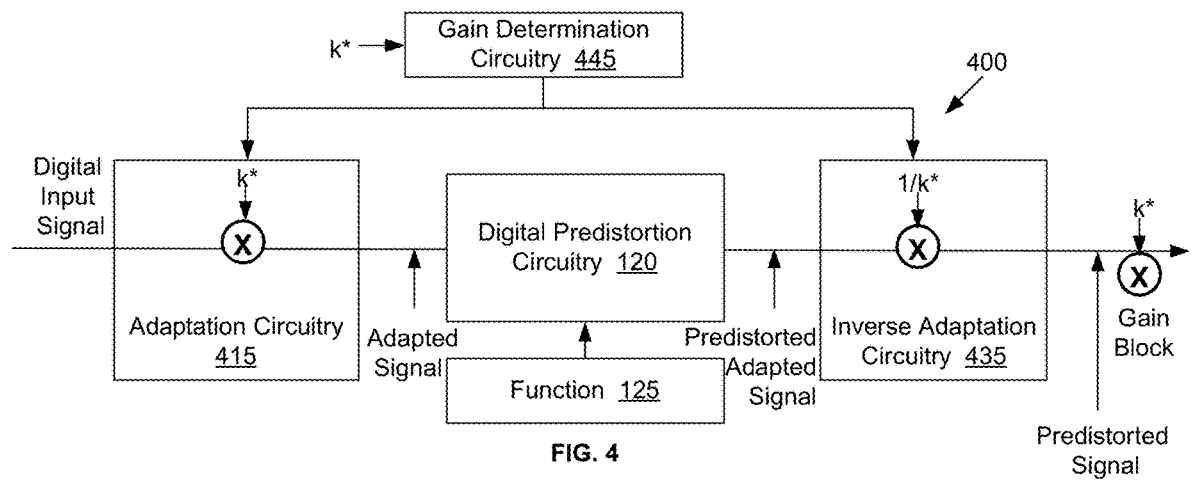
FIG. 4 illustrates an exemplary predistortion system that includes adaptation circuitry and inverse adaptation circuitry to adapt an input signal to compensate for a difference in transmit chain state as compared to a transmit chain state used during calibration or learning, in accordance with various aspects described.

FIG. 4 illustrates an exemplary predistortion system 400 that is able to use a predistortion function 125 derived for a first transmit chain state for a second transmit chain state. It can be seen in FIG. 4 that a gain block (e.g., multiplier k*) has been introduced into the transmit chain after the digital predistortion circuitry 120. The gain block may be located in the BB domain or the RF domain (e.g., either before or after the RF signal generation circuitry 130 of FIG. 1). In one example, the gain block is used to optimize a transmit characteristic such as the transmit noise depending on antenna power. In the BB domain, the gain block may be variable and used to optimize the input level range of a digital to analog converter (DAC) in the RF domain to optimize the drive level of a mixer. The presence of the gain block after the digital predistortion circuitry 120 means that the transmit chain may operate in several gain states and that the gain setting might change after the calibration of the predistortion function 125.

A generic way that the predistortion function 125 can be derived will now be presented. For the purposes of this description, the digital input signal is denoted x(t) and the predistorted signal (e.g., output of the digital predistortion circuitry 120) is denoted as z(t). The output of the PA system is y(t)=k*x(t) where k is the desired gain. The PA system exhibits some nonlinear characteristic described by the function F(z). Basically, the predistortion function H(x) is derived to be the inverse of F(z) as follows:

$$y(x)=k^{*}x=F[H(x)] \rightarrow H(x)=F^{-1}[k^{*}x]=\tilde{F}^{-1}[x] \qquad \text{EQ 1}$$

The gain k is absorbed into the predistortion function as indicated by $\tilde{F}^{-1}[x]$.

If during calibration the gain block has a first setting k*_1, the predistortion function is based on the first (or "calibration") gain k*_1. If, after calibration, the setting of the gain block is changed to a second (or "operation") gain setting, then the previously calibrated predistortion function $\tilde{F}^{-1}[x]$ will provide an incorrect predistortion result and subsequent degradation of the transmit chain linearity at the antenna as follows:

$$y(x) = k^{*} * k * x = \qquad \text{EQ 2}$$
$$F[k^{*} * H(x)] \rightarrow H(x) = \frac{1}{k^{*}} F^{-1}[k^{*} * k * x] = \frac{1}{k^{*}} \tilde{F}^{-1}[k^{*} * x]$$

This is because the gain setting k* changes the drive level of the PA system. A different drive level causes a different level of the intermodulation (IM) products, (e.g., 1 dB higher drive levels increase the level of IMC production by 3 dB. However, the predistortion function does not capture the changed IM3 level at the PA output since the PA drive level change happens after the digital predistortion circuitry 120. As a result the IM3 products generated by the digital predistortion circuitry 120 do not cancel anymore the IM3 products generated by the PA system since the IM3 levels do not fit.

To compensate for different gain states in the transmit chain, the system 400 includes adaptation circuitry 415 and inverse adaptation circuitry 435 that allow the predistortion function derived for a first gain state to be reused for a second gain state without further calibration or learning. Gain determination circuitry 445 determines the post predistortion gain k* and controls the adaptation circuitry 415 and inverse adaptation circuitry 435 based on the post predistortion gain k*. The adaptation circuitry 415 includes a multiplier that multiplies the digital input signal by the post predistortion gain k*. The inverse adaptation circuitry 435 includes a multiplier that multiplies the predistorted adapted signal by the reciprocal of the gain k*. A derivation of the system 400, which works to reuse a predistortion function (e.g., DPD coefficients), follows.

Recall, from EQ 2 above, that $$y(x) = k^* * k * x =$$

$$F[k^* * H(x)] \rightarrow H(x) = \frac{1}{k^*} F^{-1}[k^* * k * x] = \frac{1}{k^*} F^{-1}[k^* * x].$$

EQ 3

After calibration the following relationship is valid with k*=1.

$$F[H(x)] = x$$

EQ 4 assuming k=1 for simplicity. As a consequence the following identity is also valid (since linearization works for all arguments of H):

$$F[H(k^{}x)] = k^{}x$$

EQ 5

When the gain changes to k* by means of the gain block is introduced, the linearization is broken since the multiplication is not captured during calibration:

$$F[k^{}H(k^{}x)]k^{**}x$$

EQ 6

However, with the adaptation circuitry 415 and the inverse adaptation circuitry 435 the following relationship applies:

$$F\left[\frac{1}{k^*} * k^* * H(k^* * x)\right] = F[H(k^* * x)] = k^* * x$$

EQ 7

It can be seen that the operations performed by the adaptation circuitry 415 and the inverse adaptation circuitry 435 remove the drive level change due to k*. As a result, the digital predistortion circuitry 120 can use the predistortion function derived for the original gain state. The multiplication by the adaptation circuitry 415 sets the correct gain level. If the total gain is unchanged then the k*=1 for the first multiplier. This may happen if the adaptation of the dynamic range of a mixer device or digital to analog converter (DAC) causes an unwanted gain change k*.

In one example, the gain determination circuitry 445 is implemented in executable instructions that cause the monitoring of a register in which the post predistortion gain k* is stored. In one example, the gain determination circuitry 445 is implemented in hardware that uses dedicated control lines to set the multipliers in the adaptation circuitry 415 and inverse adaptation circuitry 435 based on the post predistortion gain k*.

Figure 5:
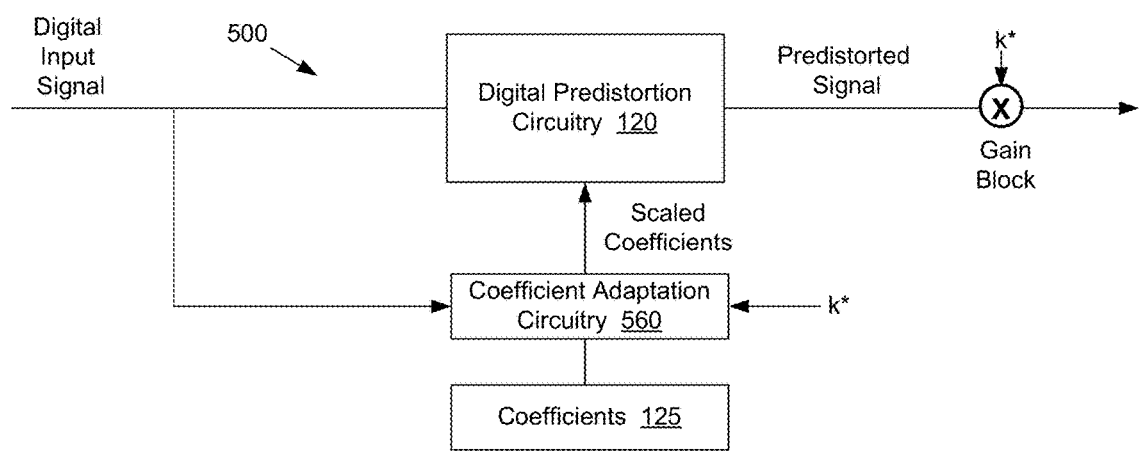
FIG. 5 illustrates an exemplary predistortion system that includes coefficient adaptation circuitry to adapt predistortion function coefficients to compensate for a difference in transmit chain state as compared to a transmit chain state used during calibration or learning, in accordance with various aspects described.

FIG. 5 illustrates an alternative example of a predistortion system 500 that can reuse stored DPD coefficients (e.g., predistortion function) that were determined with a different gain setting. The system 500 includes a coefficient adaptation circuitry 560 that rescales the coefficients based on the post predistortion gain k*. A generic memory polynomial representation of a predistortion function is:

$$z(n) = \sum_{p=1}^{K} z_p(n) \text{ with}$$

Eq 8

$$z_p(n) =$$

$$\sum_{k_l=0}^{N} \cdots \sum_{k_p=0}^{N} h_{k_1,\ldots,k_p}^{(p)} x(n-k_1) \prod_{u=3,5,\ldots}^{p} x(n-k_{u-1})x^*(n-k_u)$$

where N is the memory depth, p is the order of the predistortion function polynomial, K is the max order, and n is the discrete time index. The gain ratio between calibration and operation is described by factor a=k*. Rescaling of the polynomial to reflect the gain ratio results in a polynomial with gain compensation:

$$z_p(n) = \sum_{k_l=0}^{N} \cdots \sum_{k_p=0}^{N} a^{p-1} h_{k_1,\ldots,k_p}^{(p)} x(n-k_1) \prod_{u=3,5,\ldots}^{p} x(n-k_{u-1})x^*(n-k_u)$$

The important change is that each DPD coefficient $h^{(p)}$ (e.g., weight for a p order polynomial) is scaled by $a^{p-1}$ to $a^{p-1} \cdot h^{(p)}$. Scaling of the coefficients in this manner can be implemented in executable instructions and does not require hardware.

Figure 6:
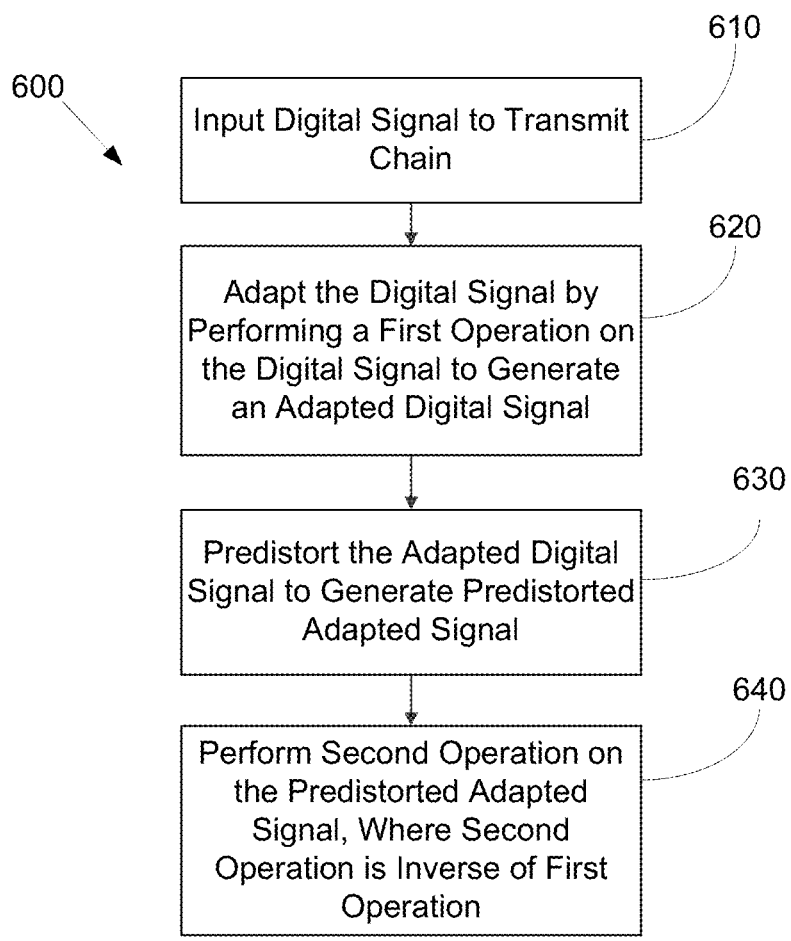
FIG. 6 illustrates a flow diagram of an exemplary method for adapting an input signal to compensate for a difference between the input signal and a signal used in calibration or learning or a difference in transmit chain state as compared to a transmit chain state used during calibration or learning in accordance with various aspects described.

FIG. 6 illustrates a flow diagram of an exemplary method 600 for predistorting a digital signal in a transmit chain based on a predistortion function that was determined based on a first digital signal (e.g., calibration signal) or a first transmit chain. The method may be performed by the predistortion system 300 of FIG. 3 and/or 400 of FIG. 4. The method includes, at 610, inputting a second digital signal (e.g., transmit signal or digital input signal) to the transmit chain, wherein the transmit chain is characterized by a present transmit chain state. At 620, the second digital signal is adapted by performing a first operation on the second digital signal to generate an adapted digital signal. The first operation is based on either a relationship between the first digital signal and the second digital signal, or a relationship between the first transmit chain state and the present transmit chain state. At 630, the method includes predistorting the adapted digital signal based on the predistortion function to generate a predistorted adapted signal. At 640, a second operation is then performed on the predistorted adapted signal. The second operation corresponds to an inverse of the first operation.

It can be seen from the foregoing description that adapting a transmit signal to compensate for differences in the transmit signal and a calibration signal or the transmit chain state and a calibration transmit chain state prior to predistortion and performing an inverse adaptation of the transmit signal after predistortion allows a predistortion function determined during calibration to be used with signals that are different from the calibration signal or in different transmit chain states as compared to a calibration transmit chain state. Further, the predistortion function may be modified or scaled without recalibration based on a post predistortion gain that is different from a post predistortion gain during calibration.

Figure 7:
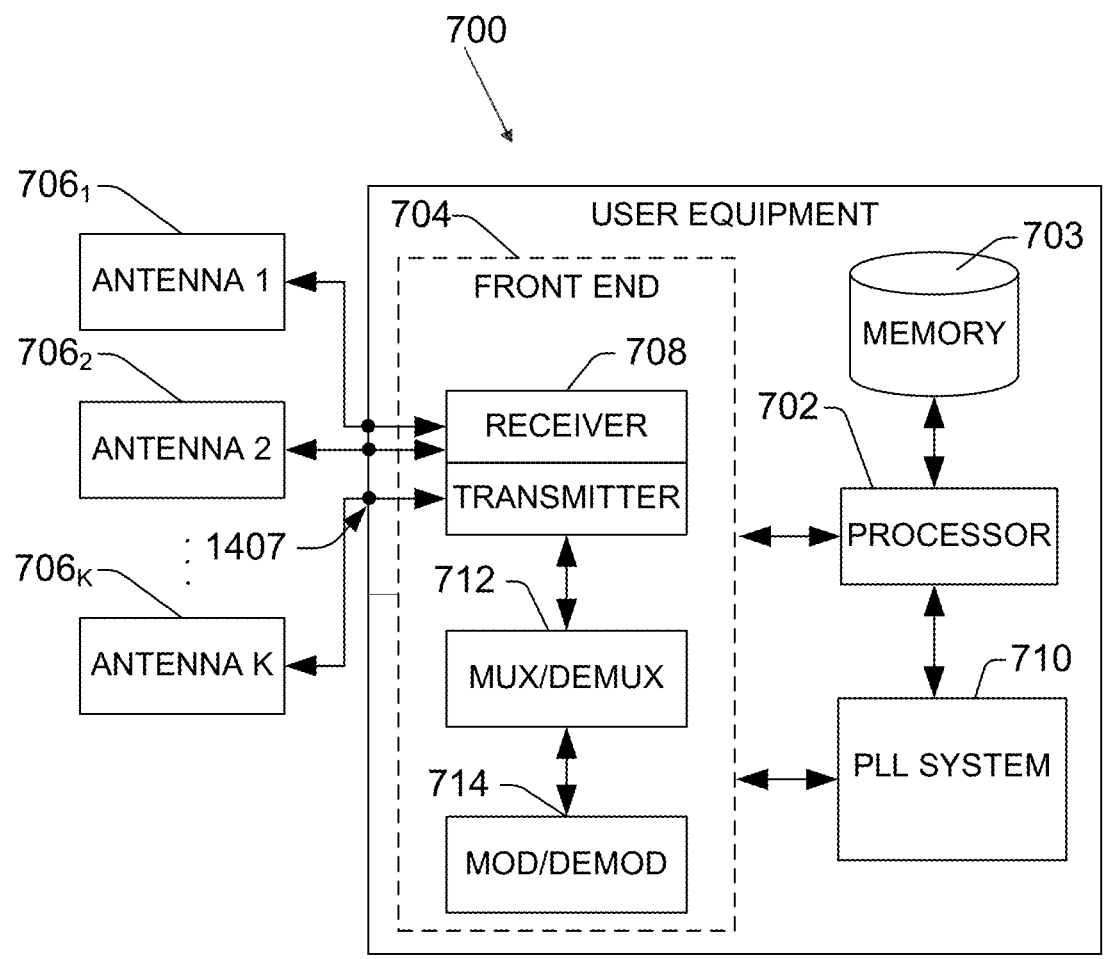
FIG. 7 illustrates an example user equipment device that includes predistortion system in accordance with various aspects described.

To provide further context for various aspects of the disclosed subject matter, FIG. 7 illustrates a block diagram of an embodiment of user equipment 700 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 700 can be utilized with one or more aspects of the predistortion systems described herein according to various aspects. The user equipment device 700, for example, comprises a digital baseband processor 702 that can be coupled to a data store or memory 703, a front end 704 (e.g., an RF front end, an acoustic front end, or the other like front end) and a plurality of antenna ports 707 for connecting to a plurality of antennas 7061 to 706k (k being a positive integer). The antennas 7061 to 706k can receive and transmit signals to and from one or more wireless devices such as access points, access terminals, wireless ports, routers and so forth, which can operate within a radio access network or other communication network generated via a network device (not shown).

The user equipment 700 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 704 can include a communication platform, which comprises electronic components and associated circuitry that provide for processing, manipulation or shaping of the received or transmitted signals via one or more receivers or transmitters (e.g. transceivers) 708, a mux/demux component 712, and a mod/demod component 714. The front end 704 is coupled to the digital baseband processor 702 and the set of antenna ports 707, in which the set of antennas 7061 to 706k can be part of the front end. In one aspect, the user equipment device 700 can comprise a phase locked loop system 710.

The processor 702 can confer functionality, at least in part, to substantially any electronic component within the mobile communication device 700, in accordance with aspects of the disclosure. As an example, the processor 700 can be configured to execute, at least in part, executable instructions that adapt, predistort, and inverse adapt a digital signal as described herein. Thus the processor 700 may embody various aspects of the adaptation circuitry 315,415 and/or inverse adaptation circuitry 335, 435 of FIGS. 3 and 4, respectively, and/or the coefficient adaptation circuitry 560 of FIG. 5.

The processor 702 is functionally and/or communicatively coupled (e.g., through a memory bus) to memory 703 in order to store or retrieve information necessary to operate and confer functionality, at least in part, to communication platform or front end 704, the phase locked loop system 710 and substantially any other operational aspects of the phase locked loop system 710. The phase locked loop system 710 includes at least one oscillator (e.g., a VCO, DCO or the like) that can be calibrated via core voltage, a coarse tuning value, signal, word or selection process as described herein.

The processor 702 can operate to enable the mobile communication device 700 to process data (e.g., symbols, bits, or chips) for multiplexing/demultiplexing with the mux/demux component 712, or modulation/demodulation via the mod/demod component 714, such as implementing direct and inverse fast Fourier transforms, selection of modulation rates, selection of data packet formats, inter-packet times, etc. Memory 703 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation. Memory 703 may include a static random access memory (SRAM) or dynamic RAM that stores a predistortion function 125 of FIGS. 1 and 3-5.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a method to predistort a digital signal in a transmit chain based on a predistortion function, wherein the predistortion function is determined based on a first digital signal or a first transmit chain state. The method includes: receiving a second digital signal that is input to the transmit chain, wherein the transmit chain is characterized by a present transmit chain state; performing a first operation on the second digital signal to generate an adapted digital signal, wherein the first operation is based on either a relationship between the first digital signal and the second digital signal, or a relationship between the first transmit chain state and the present transmit chain state; predistorting the adapted digital signal based on the predistortion function to generate a predistorted adapted signal; and performing a second operation on the predistorted adapted signal, wherein the second operation corresponds to an inverse of the first operation.

Example 2 includes the subject matter of example 1, including or omitting optional elements, wherein the first digital signal is characterized by a calibration center frequency and the second digital signal is characterized by an operation center frequency. The method further includes determining an offset between the calibration center frequency of the first digital signal and the operation center frequency of the second digital signal. Performing the first operation includes shifting a center frequency of the second digital signal by the offset. Performing the second operation includes reverting the shifting of the center frequency of the predistorted adapted signal by the offset.

Example 3 includes the subject matter of example 2, including or omitting optional elements, wherein the calibration center frequency is mapped to a second operation center frequency in the predistortion function in a baseband frequency domain.

Example 4 includes the subject matter of example 2, including or omitting optional elements, wherein the center frequency is shifted by a CORDIC.

Example 5 includes the subject matter of examples 1-4, including or omitting optional elements, wherein the first transmit chain state is characterized by a calibration gain and the present transmit chain state is characterized by an operation gain. The method further includes determining that the calibration gain is different from the operation gain. The first operation includes scaling the second digital signal by the operation gain and the second operation includes scaling the predistorted adapted signal by a reciprocal of the operation gain.

Example 6 includes the subject matter of examples 1-4, including or omitting optional elements, wherein the first transmit chain state is characterized by a calibration gain and the present transmit chain state is characterized by an operation gain. The method further includes: determining that the calibration gain is different from the operation gain; scaling the predistortion function based on a ratio between the calibration gain and the operation gain; and predistorting the adapted signal based on the scaled predistortion function.

Example 7 includes the subject matter of examples 1-4, including or omitting optional elements, wherein the predistortion function includes summation of weighted past values of the second digital signal and a weighted present value of the second digital signal, wherein the weights of the past values and the present values are determined based on predetermined coefficients.

Example 8 includes the subject matter of examples 1-4, including or omitting optional elements, wherein the first signal includes a calibration signal generated during a learning phase of the transmit chain.

Example 9 is a system configured to predistort a digital signal in a transmit chain including memory, adaptation circuitry, predistortion circuitry, and inverse adaptation circuitry. The memory is configured to store a predistortion function that is determined based on a first digital signal or a first transmit chain state. The adaptation circuitry is configured to receive a second digital signal that is input to the transmit chain, wherein the transmit chain is characterized by a present transmit chain state; and perform a first operation on the second digital signal to generate an adapted digital signal, wherein the first operation is based on either a relationship between the first digital signal and the second digital signal, or a relationship between the first transmit chain state and the present transmit chain state. The predistortion circuitry is configured to predistort the adapted digital signal based on the predistortion function to generate a predistorted adapted signal. The inverse adaptation circuitry is configured to perform a second operation on the predistorted adapted signal, wherein the second operation corresponds to an inverse of the first operation.

Example 10 includes the subject matter of example 9, including or omitting optional elements, wherein the first digital signal is characterized by a calibration center frequency and the second digital signal is characterized by an operation center frequency. The system further includes offset determination circuitry configured to determine an offset between the calibration center frequency and the operation center frequency. The adaptation circuitry is configured to shift the center frequency of the second digital signal by the offset. The inverse adaptation circuitry is configured to revert the shifting of the center frequency of the predistorted adapted signal by the offset.

Example 11 includes the subject matter of example 10, including or omitting optional elements, wherein the calibration center frequency is mapped to a second operation center frequency in the predistortion function in a baseband frequency domain.

Example 12 includes the subject matter of example 9, including or omitting optional elements, wherein the adaptation circuitry includes a CORDIC.

Example 13 includes the subject matter of examples 9-12, including or omitting optional elements, wherein the first transmit chain state is characterized by a calibration gain and the present transmit chain state is characterized by an operation gain. The system includes gain determination circuitry configured to determine that the calibration gain is different from the operation gain. The adaptation circuitry is configured to scale the second digital signal by the operation gain. The inverse adaptation circuitry is configured to scale the predistorted adapted signal by a reciprocal of the operation gain.

Example 14 includes the subject matter of examples 9-12, including or omitting optional elements, wherein the first transmit chain state is characterized by a calibration gain and the present transmit chain state is characterized by an operation gain. The system includes coefficient adaptation circuitry configured to: determine that the calibration gain is different from the operation gain; and scale the predistortion function based on a ratio between the calibration gain and the operation gain. The digital predistortion circuitry is configured to predistort the adapted signal based on the scaled predistortion function.

Example 15 includes the subject matter of examples 9-12, including or omitting optional elements, wherein the predistortion function includes summation of weighted past values of the second digital signal and a weighted present value of the second digital signal, wherein the weights of the past values and the present values are determined based on predetermined coefficients.

Example 16 includes the subject matter of examples 9-12, including or omitting optional elements, wherein the first signal includes a calibration signal generated during a learning phase of the transmit chain.

Example 17 is a system configured to predistort a digital signal in a transmit chain that includes memory, coefficient adaptation circuitry, and digital predistortion circuitry. The memory is configured to store a predistortion function that is determined based on a calibration gain of the transmit chain during calibration. The coefficient adaptation circuitry is configured to: receive a second digital signal that is input to the transmit chain, wherein the transmit chain is characterized by an operation gain; determine that the calibration gain is different from the operation gain; and scale the predistortion function based on the calibration gain and the operation gain. The digital predistortion circuitry is configured to predistort the second digital signal based on the scaled predistortion function to generate a predistorted signal.

Example 18 includes the subject matter of example 17, including or omitting optional elements, wherein the predistortion function includes summation of weighted past values of the second digital signal and a weighted present value of the second digital signal, wherein the weights of the past values and the present values are determined based on predetermined coefficients.

Example 19 includes the subject matter of example 18, including or omitting optional elements, wherein the coefficient adaptation circuitry is configured to scale the predistortion function based on a ratio between the calibration gain and the operation gain.

Example 20 includes the subject matter of examples 1719, including or omitting optional elements, wherein the predistortion function is determined based on a calibration signal having a calibration center frequency; the second digital signal is characterized by an operation center frequency; and the system further includes: offset determination circuitry configured to determine an offset between the calibration center frequency and the operation center frequency; adaptation circuitry configured to shift the center frequency of the second digital signal by the offset to generate an adapted second digital signal; and inverse adaptation circuitry configured to revert the shifting of the center frequency of the predistorted adapted second signal by the offset.

Example 21 is an apparatus configured to predistort a digital signal in a transmit chain based on a predistortion function determined based on a first digital signal or a first transmit chain state. The apparatus includes: means for receiving a second digital signal that is input to the transmit chain, wherein the transmit chain is characterized by a present transmit chain state; means for adapting the second digital signal by performing a first operation on the second digital signal to generate an adapted digital signal, wherein the first operation is based on either a relationship between the first digital signal and the second digital signal, or a relationship between the first transmit chain state and the present transmit chain state; means for predistorting the adapted digital signal based on the predistortion function to generate a predistorted adapted signal; and means for performing a second operation on the predistorted adapted signal, wherein the second operation corresponds to an inverse of the first operation.

Example 22 includes the subject matter of example 21, including or omitting optional elements, wherein the first digital signal is characterized by a calibration center frequency and the second digital signal is characterized by an operation center frequency. The apparatus further includes means for determining an offset between the calibration center frequency and an operation center frequency of the second digital signal; and the first operation includes shifting the center frequency of the second digital signal by the offset; and the second operation includes reverting the shifting of the center frequency of the predistorted adapted signal by the offset.

Example 23 includes the subject matter of examples 21-22, including or omitting optional elements, wherein the first transmit chain state is characterized by a calibration gain and the present transmit chain state is characterized by an operation gain. The apparatus further includes means for determining that the calibration gain is different from the operation gain. The first operation includes scaling the second digital signal by the operation gain. The second operation includes scaling the predistorted adapted signal by a reciprocal of the operation gain.

Example 24 includes the subject matter of examples 21-22, including or omitting optional elements, wherein the first transmit chain state is characterized by a calibration gain and the present transmit chain state is characterized by an operation gain. The apparatus further includes means for determining that the calibration gain is different from the operation gain; means for scaling the predistortion function based on a ratio between the calibration gain and the operation gain; and means for predistorting the adapted signal based on the scaled predistortion function.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may include one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A system configured to predistort a digital signal in a transmit chain based on a predistortion function, the system comprising:
   a memory configured to store a predistortion function that is determined based on a calibration signal having a calibration center frequency;
   offset determination circuitry configured to:
      receive a digital signal that is input to the transmit chain, wherein the digital signal is characterized by an operation center frequency; and
      determine an offset between the operation center frequency and the calibration center frequency;
   adaptation circuitry configured to shift a center frequency of the digital signal by the offset to generate an adapted signal; and
   digital predistortion circuitry configured to predistort the adapted signal based on the predistortion function to generate a predistorted adapted signal; and
   inverse adaptation circuitry configured to revert the shifting of the center frequency of the predistorted adapted signal by the offset.

2. The system of claim 1, wherein the calibration center frequency is mapped to a second operation center frequency in the predistortion function in a baseband frequency domain.

3. The system of claim 1, wherein the center frequency is shifted by a coordinate rotation digital computer (CORDIC).

4. The system of claim 1, further comprising:
   gain determination circuitry configured to determine an operation gain of the transmit chain,
   wherein the adaptation circuitry is configured to, when the operation gain is different from a calibration gain, scale the digital signal by the operation gain to generate the adapted signal; and
   wherein the inverse adaptation circuitry is configured to, when the operation gain is different from the calibration gain, scale the predistorted adapted signal by a reciprocal of the operation gain.

5. The system of claim 1, further comprising:
   gain determination circuitry configured to determine an operation gain for the transmit chain; and
   wherein the adaptation circuitry is configured to, when the operation gain is different from a calibration gain, scale the predistortion function based on a ratio between the calibration gain and the operation gain; and
   wherein the digital predistortion circuitry is configured to predistort the adapted signal based on the scaled predistortion function.

6. The system of claim 4, wherein the gain determination circuitry is configured to determine the operation gain based on a gain setting for a gain block of the transmit chain.

7. The system of claim 1, wherein the calibration center frequency corresponds to a frequency of a calibration signal generated during a learning phase of the transmit chain.

8. A system configured to predistort a digital signal in a transmit chain, wherein the system comprises:
   a memory configured to store a predistortion function that is determined based on a calibration signal;
   gain determination circuitry configured to determine an operation gain of the transmit chain;
   adaptation circuitry configured to:
      receive a digital signal that is input to the transmit chain; and
      scale the digital signal by the operation gain to generate an adapted signal;
   digital predistortion circuitry configured to predistort the adapted signal based on the predistortion function to generate a predistorted adapted signal; and
   inverse adaptation circuitry configured to scale the predistorted adapted signal by a reciprocal of the operation gain.

9. The system of claim 8, further comprising:
   offset determination circuitry configured to determine an offset between a calibration center frequency of the calibration signal and an operation center frequency of the digital signal;
   the adaptation circuitry is configured to shift the operation center frequency of the digital signal by the offset to generate the adapted signal; and
   the inverse adaptation circuitry is configured to revert the shifting of the center frequency of the predistorted adapted signal by the offset.

10. The system of claim 9, wherein the calibration center frequency is mapped to a second operation center frequency in the predistortion function in a baseband frequency domain.

11. The system of claim 9, wherein the adaptation circuitry comprises a CORD IC.

12. The system of claim 8, further comprising coefficient adaptation circuitry configured to:
   determine that a calibration gain of the calibration signal is different from the operation gain; and
   scale the predistortion function based on a ratio between the calibration gain and the operation gain; and
   wherein the digital predistortion circuitry is configured to predistort the adapted signal based on the scaled predistortion function.

13. The system of claim 8, wherein the gain determination circuitry is configured to determine the operation gain based on a gain setting for a gain block of the transmit chain.

14. The system of claim 8, wherein the calibration signal is generated during a learning phase of the transmit chain to determine the predistortion function.

15. A system configured to predistort a digital signal in a transmit chain, wherein the system comprises:
   a memory configured to store a predistortion function that is determined based on a calibration gain of the transmit chain during calibration;
   coefficient adaptation circuitry configured to:
      receive a digital signal that is input to the transmit chain;
      determine an operation gain of the transmit chain;
      determine that the calibration gain is different from the operation gain; and scale the predistortion function based on the calibration gain and the operation gain; and digital predistortion circuitry configured to predistort the second digital signal based on the scaled predistortion function to generate a predistorted signal.

16. The system of claim 15, wherein the coefficient adaptation circuitry is configured to determine the operation gain based on a gain setting for a gain block of the transmit chain.

17. The system of claim 15, wherein the coefficient adaptation circuitry is configured to scale coefficients of the predistortion function based on a ratio between the calibration gain and the operation gain.

18. The system of claim 15, wherein:

the predistortion function is determined based on a calibration signal having a calibration center frequency;

the digital signal is characterized by an operation center frequency;

the system further comprises:

offset determination circuitry configured to determine an offset between the calibration center frequency and the operation center frequency;

adaptation circuitry configured to shift a center frequency of the digital signal by the offset to generate an adapted signal; and inverse adaptation circuitry configured to revert the shifting of the center frequency of the predistorted signal by the offset.

* * * * *